(12) United States Patent
Graves-Abe et al.

(10) Patent No.: US 9,476,927 B2
(45) Date of Patent: Oct. 25, 2016

(54) STRUCTURE AND METHOD TO DETERMINE THROUGH SILICON VIA BUILD INTEGRITY

(71) Applicant: GLOBALFOUNDRIES INC., Grand Cayman (KY)

(72) Inventors: Troy L. Graves-Abe, Wappingers Falls, NY (US); Chandrasekharan Kothandaraman, Hopewell Junction, NY (US); Conal E. Murray, Yorktown Heights, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 158 days.

(21) Appl. No.: 14/161,309

(22) Filed: Jan. 22, 2014

(65) Prior Publication Data

US 2015/0204932 A1   Jul. 23, 2015

(51) Int. Cl.
| | |
|---|---|
| *G01R 31/02* | (2006.01) |
| *H01L 21/66* | (2006.01) |
| *H01L 23/48* | (2006.01) |
| *G01R 31/26* | (2014.01) |
| *G01M 5/00* | (2006.01) |

(52) U.S. Cl.
CPC .......... *G01R 31/021* (2013.01); *G01M 5/0033* (2013.01); *G01M 5/0083* (2013.01); *G01R 31/26* (2013.01); *H01L 22/34* (2013.01); *H01L 23/481* (2013.01); *H01L 2924/0002* (2013.01)

(58) Field of Classification Search
None
See application file for complete search history.

(56) References Cited

U.S. PATENT DOCUMENTS

| | | |
|---|---|---|
| 7,884,015 B2 | 2/2011 | Sulfridge |
| 7,902,069 B2 | 3/2011 | Andry et al. |
| 7,906,431 B2 | 3/2011 | Mistuhashi |
| 7,960,282 B2 | 6/2011 | Yelehanka et al. |
| 7,969,193 B1 | 6/2011 | Wu et al. |
| 8,067,312 B2 | 11/2011 | Trezza |
| 8,133,774 B2* | 3/2012 | Botula .............. H01L 21/76264 257/E27.112 |
| 8,323,990 B2 | 12/2012 | Shi et al. |
| 8,347,728 B2 | 1/2013 | Aitken |
| 8,354,736 B2 | 1/2013 | Moroz |
| 8,754,412 B2* | 6/2014 | Yu ........................ H01L 22/34 257/48 |
| 2003/0201488 A1* | 10/2003 | Nii ....................... H01L 21/743 257/314 |
| 2011/0095435 A1 | 4/2011 | Volant et al. |
| 2011/0101347 A1 | 5/2011 | Henderson et al. |
| 2011/0143535 A1 | 6/2011 | Pares |
| 2011/0193197 A1 | 8/2011 | Farooq et al. |
| 2011/0234893 A1 | 9/2011 | Koseki |

(Continued)

OTHER PUBLICATIONS

Amagai, M., et al. "TSV Stress Testing and Modeling" Electronic Components and Technology Conference (ECTC), 2010 Proceedings 60th. Jun. 2010. pp. 1273-1280.

(Continued)

*Primary Examiner* — Andres Munoz
(74) *Attorney, Agent, or Firm* — Hoffman Warnick LLC; Yuanmin Cai

(57) ABSTRACT

A structure to detect changes in the integrity of vertical electrical connection structures including a semiconductor layer and an electrically conductive material extending through an entire depth of the semiconductor layer. The electrically conductive material has a geometry that encloses a pedestal portion of the semiconductor layer within an interior perimeter of the electrically conductive material. At least one semiconductor device is present on the pedestal portion of the semiconductor layer within the perimeter of the electrically conductive material.

12 Claims, 6 Drawing Sheets

(56) References Cited

U.S. PATENT DOCUMENTS

| | | |
|---|---|---|
| 2011/0291287 A1 | 12/2011 | Wu et al. |
| 2011/0309357 A1 | 12/2011 | Tain et al. |
| 2011/0316168 A1 | 12/2011 | Moon et al. |
| 2012/0018851 A1 | 1/2012 | Farooq et al. |
| 2012/0319248 A1* | 12/2012 | Rahman ................ H01L 23/147 257/621 |
| 2013/0168673 A1* | 7/2013 | Yu ............................ H01L 22/34 257/48 |

OTHER PUBLICATIONS

Tzeng, P., et al. "Design, Fabrication, and Calibration of Stress Sensors Embedded in a TSV Interposer in a 300mm Wafer" Electronic Components and Technology Conference (ECTC), 2012 IEEE 62nd. May 2012. pp. 1731-1737.

Anonymous. "Method for CMOS-based Stress Sensors for Through-Silicon Vias" The IP.com Prior Art Database, Jun. 2006. 4 Pages.

* cited by examiner

STRUCTURE AND METHOD TO DETERMINE THROUGH SILICON VIA BUILD INTEGRITY

BACKGROUND

1. Technical Field

The present disclosure relates to structures for communicating electrical signals, and more particularly to through silicon via (TSV) structures.

2. Description of the Related Art

There is an ongoing trend to increase the performance of a semiconductor chip by shifting from a two-dimensional (2D) chip architecture to a three-dimensional (3D) chip architecture. This requires a vertical interconnect between wafer-to-wafer. Through-silicon vias (TSV's), which convey current through stacked Si substrates or Si interposers, represent one component for the creation of three-dimensional integrated circuitry. During the manufacture of TSV's, voids within the conducting material or delamination between the conductor and surrounding environment can lead to failure of the TSV if the current density is sufficiently high. Current methods to detect voids within TSV's involve destructive methods, such as cross-sectional scanning electron microscopy, rendering the part useless.

SUMMARY

In one aspect of the present disclosure, a structure is provided for detecting changes in the integrity of vertical electrical connection structures. In one embodiment, the structure for detecting delamination in vertical electrical connection structures includes a semiconductor layer and an electrically conductive material extending through an entire depth of the semiconductor layer. The electrically conductive material has a geometry that encloses a pedestal portion of the semiconductor layer within an interior perimeter of the electrically conductive material. At least one semiconductor device is present on the pedestal portion of the semiconductor layer within the perimeter of the electrically conductive material, wherein the at least one semiconductor device detects stress in the pedestal portion of the semiconductor layer. The stress detected by the semiconductor device is correlated to the incidence of delamination and/or voiding of the electrically conductive material.

In another aspect of the present disclosure, a method of forming a structure for detecting changes in the integrity of electrical connection structures is provided that includes forming an electrically conductive material extending through an entire depth of a semiconductor layer, wherein the electrically conductive material has a geometry that encloses a pedestal portion of the semiconductor layer within an interior perimeter of the electrically conductive material. A reference semiconductor device is formed on a substantially neutral portion of the semiconductor layer for measuring a first piezoresistive response. At least one stress measuring semiconductor device is formed on the pedestal portion of the semiconductor layer. A second piezoresistive response measured from the at least one stress measuring semiconductor device that is different from the first piezoresistive response measured from the reference semiconductor device indicates a stress induced by the electrically conductive material on the pedestal portion of the semiconductor layer.

In another aspect of the present disclosure, a method of monitoring electrical connection structures is provided that includes providing a plurality of electrical connection structures that each include an electrically conductive material extending through an entire depth of a semiconductor layer. The electrically conductive material has a geometry that encloses a pedestal portion of the semiconductor layer, wherein at least one semiconductor device is present on the pedestal portion of the semiconductor layer. Changes in the differences between the output signals from the at least one semiconductor device that is present on the pedestal portion for each of the plurality of electrical connection structures and a reference semiconductor device that is present on a stress neutral portion of the semiconductor layer are monitored to determine the incidence of delamination in the electrical connection structures and/or the presence of voids in the electrical connection structures. Electrical transmission is shut down through the delaminated electrical communication structures and/or electrical connection structures containing voids by rerouting the electrical communication to functional electrical communication structures in the plurality of electrical communication structures.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
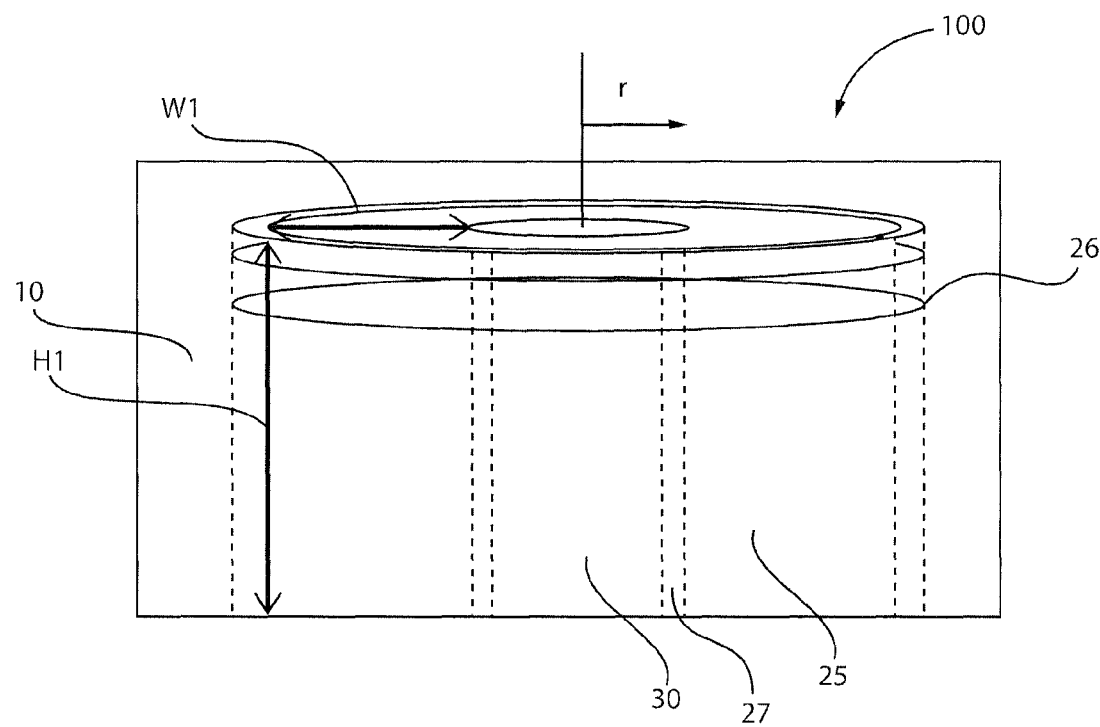
FIG. 1 is a side cross-sectional view depicting one embodiment of an annular through silicon via (TSV) structure, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein detect delamination and/or voiding in through silicon via (TSV) structures. The term "integrity" as used to describe electrical connections refers to the presence of delamination and voiding in the electrical connection. A through silicon via (TSV) is a vertical electrical connection that passes completely through a material layer in an electrical device including semiconductor devices. For example, the TSV may pass completely though a semiconductor substrate, such as a silicon containing substrate (also referred to as wafer) or die. Although the term through silicon via (TSV) references a silicon material, the present disclosure is not limited to only vertical electrical connections that are though silicon materials, as the vertical electrical connections disclosed herein may extend through any semiconductor material. It has been determined that the electrically conductive material, e.g., metal, of the TSV structure induces stress on a "pedestal" portion of the semiconductor layer present within the perimeter of an electrically conductive material, e.g., metal, of the TSV structure. As used herein, the "pedestal" portion of the TSV structure is the portion of the semiconductor substrate within the perimeter that is defined by the electrically conductive material of the TSV structure. If the electrically conductive material of the TSV structure delaminates from the pedestal portion of the semiconductor layer, the stress that is typically induced on the pedestal portion is relaxed. By providing the ability to detect the stress that is present in the TSV structure, the methods and structures disclosed herein enable detection of whether delamination and voiding has occurred in the TSV structure. In one embodiment, the present disclosure provides a structure to detect stress in an annular TSV structure, wherein the structure includes at least one device, e.g., semiconductor device, for sensing piezoresistive response to the application of a stress, such as a tensile or compressive stress. The semiconductor device for sensing piezoresistive stress is located within a 'pedestal' portion of the TSV structure to detect the stress induced on the pedestal portion of the TSV structure by the electrically conductive material of the TSV structure. A reference semiconductor device may be present in a portion of the TSV structure that is not subjected to the stress induced by the electrically conductive material of the annular TSV structure. The reference semiconductor device provides a baseline for comparison with the semiconductor device for detecting the stress induced on the pedestal portion of the TSV structure. In another aspect, a method of monitoring TSV structures to detect delamination and/or voiding is provided that includes monitoring a differential between output signals from the pair of devices for sensing piezoresistive response to the application of stress, and shutting down transmissions through the annular TSV (such as by rerouting to a redundant TSV) if the differential indicates impending failure of the TSV structure. The methods and structures of the present disclosure are now described in greater detail with reference to FIGS. 1 to 8.

FIG. 1 depicts one embodiment of a through silicon via (TSV) structure 100 that may be employed in the methods and structures provided by the present disclosure. Typically, the TSV structure 100 includes an electrically conductive material 25 that extends through an entire thickness of at least one semiconductor layer, e.g., semiconductor substrate 10, of an electrical device. In the embodiment depicted in FIG. 1, the TSV structure 100 extends through a semiconductor substrate 10, e.g., silicon containing substrate. For example, silicon-containing materials that are suitable for the semiconductor substrate 10 may be selected from the group consisting of silicon (Si), single crystal silicon (Si), silicon germanium (SiGe), silicon germanium doped with carbon (SiGe:C), silicon doped with carbon (Si:C), polysilicon, epitaxial silicon (epi-Si), amorphous Si (α:Si), microcrystalline silicon (μc:Si) and multi-layers thereof. The semiconductor substrate 10 may also be composed of other type IV semiconductor materials (semiconductor from Group IVA (i.e., Group 14) of the Periodic Table of Elements), such as germanium (Ge). In other embodiments, the semiconductor substrate 10 may be composed of a compound semiconductor material, such as a type III-V compound semiconductor. A type III-V semiconductor material includes Group IRA (i.e., Group 13) of the Periodic Table of Elements and at least one element from Group VA (i.e., Group 15) of the Periodic Table of Elements. Some examples of compound semiconductor materials that are suitable for use with the present disclosure include gallium arsenide (GaAs), indium arsenide (InAs), indium phosphide (InP) and other III/V or II/VI compound semiconductors. The semiconductor substrate 10 may be doped, undoped or contain doped and undoped regions therein. The semiconductor substrate 10 may be a bulk semiconductor substrate or a semiconductor on insulator (SOI) structure, e.g., silicon on insulator (SOI) structure.

The electrically conductive material 25 may be composed of a conductive metal or metal alloy. Examples of conductive metals that are suitable for the electrically conductive material include, e.g., copper (Cu), aluminum (Al), tungsten (W), platinum (Pt), silver (Ag), gold (Au) and alloys thereof. It is noted that the above compositions are provided for illustrative purposes only, and are not intended to limit the present disclosure, as any electrically conductive material 25 may be suitable for use with the present disclosure, so long as the electrically conductive material 25 has a thermal expansion differential relative to the material of the semiconductor substrate 10 that induces a stress on the pedestal portion 30 of the semiconductor substrate 10. As used herein, the term "electrically conductive" means a material typically having a room temperature conductivity of greater than $10^6$ $(\Omega\text{-m})^{-1}$.

The electrically conductive material 25 has a geometry that encloses a pedestal portion 30 of the semiconductor layer, i.e., semiconductor substrate 10, within an interior perimeter of the electrically conductive material 25. For example, the electrically conductive material 25 may have an annular geometry. By having an annular geometry, the electrically conductive material 25 may have a geometry that is circular, oblong or in the shape of an oval. The electrically conductive material 25 can also have a polyhedron geometry, i.e., multi-sided geometry. In some embodiments, the electrically conductive material 25 may have a width W1 that ranges from 1 micron to 50 microns. In another embodiment, the electrically conductive material 25 may have a width W1 that ranges from 5 microns to 15 microns. In some embodiments, the electrically conductive material 25 may have a height H1 that ranges from 10 microns to 1000 microns. In another embodiment, the electrically conductive material 25 may have a height H1 that ranges from 40 microns to 80 microns.

In some embodiments, the TSV structure 100 further includes at least one barrier layer 26, 27. The barrier layer 26, 27 may function to obstruct the diffusion of the material from the electrically conductive material 25 from diffusing into the semiconductor substrate 10 (including the pedestal portion 30 of the semiconductor substrate 10). For example, an interior barrier layer 27 is present between the electrically conductive material 25 and the pedestal portion 30, and an exterior barrier layer 26 that is present between the electrically conductive material 25 and the portion of the semiconductor substrate 10 outside an exterior perimeter of the electrically conductive material 25, i.e., field region of the semiconductor substrate 10. The composition of the barrier layer 26, 27 may be selected from the group consisting of ruthenium, iridium, rhodium, palladium, tantalum, tantalum nitride, tungsten carbonitride, tungsten nitride, and combinations thereof. Each of the barrier layers 26, 27 may have a thickness ranging from 1 nm to 10 nm. In another embodiment, each of the barrier layers 26, 27 may have a thickness ranging from 2 nm to 5 nm. In some embodiments, each of the barrier layers 26, 27 may comprise multiple layers that can include a dielectric material adjacent to portions of the semiconductor substrate 10 (which may include the pedestal portion 30). The dielectric material may be composed of an oxide, such as $SiO_2$, $ZrO_2$, $Ta_2O_5$ or $Al_2O_3$; a nitride, such as $Si_3N_4$; or combinations thereof. The dielectric layer may have a thickness ranging from 5 nm to 1000 nm. In another embodiment, the dielectric layer has a thickness ranging from 100 nm to 500 nm.

The pedestal portion 30 of the semiconductor substrate 10 is within the interior of the interior barrier layer 27 and the interior perimeter of the electrically conductive material 25. The pedestal portion 30 being a portion of the semiconductor substrate 10 is composed of at least one of the materials that have been described above for the semiconductor substrate 10. The pedestal portion 30 has a geometry dictated by the geometry of the electrically conductive material 25. For example, if the electrically conductive material 25 has an annular geometry, the pedestal portion 30 has a circular geometry. For example, in some embodiments, the radius r of the pedestal portion 30 may range from 0.5 microns to 20 microns. In other embodiments, the radius r of the pedestal portion 30 may range from 1 micron to 5 microns. In some embodiments, the pedestal portion 30 is in direct contact to the electrically conductive material 25 through the interior barrier layer 27, i.e., the pedestal portion 30 is in direct contact with the interior barrier layer 27, and the interior barrier layer 27 is in direct contact with the electrically conductive material 25. Therefore, without the incidence of delamination of the TSV structure 100 from the semiconductor substrate 10, 30, the stress resulting from the differences in thermal expansion between at least the material of the electrically conductive material 25 and the material of the semiconductor substrate 10 is induced upon the pedestal portion 30 of the semiconductor substrate 10.

Figure 2:
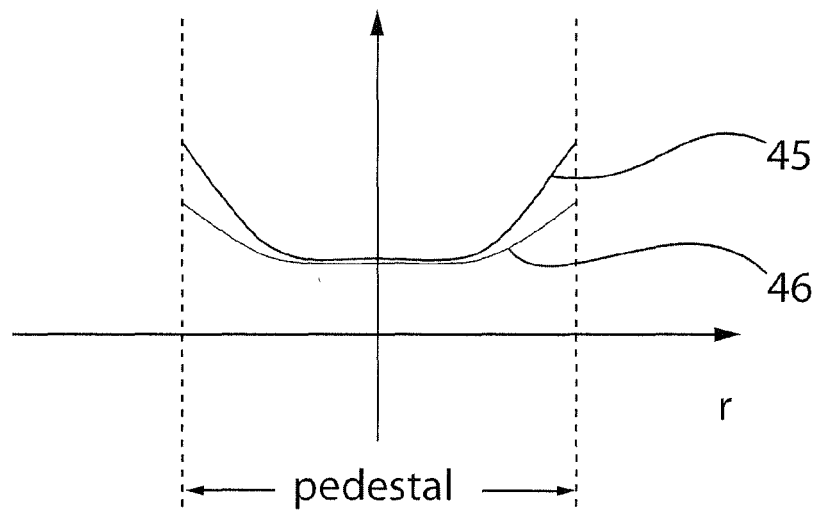
FIG. 2 is a plot of the in-plane stress generated in the pedestal portion of the semiconductor layer that the TSV structure is formed through, in accordance with one embodiment of the present disclosure.

FIG. 2 is a plot of the in-plane stress generated in the pedestal portion 30 of the semiconductor substrate 10 that the TSV structure 100 is formed through as a function of the distance r of the interior perimeter of the interior barrier layer 27 and/or the electrically conductive material 25 towards the center of the pedestal portion 30, which is equal to the radius r of the pedestal portion 30. The plot line identified by reference number 45 is the in-plane stress in the pedestal portion 30 of the semiconductor substrate 10 measured in the radial direction. The plot line identified by reference number 46 is the in-plane stress in the pedestal portion 30 of the semiconductor substrate 10 that is measured in the tangential direction. By "in-plane" stress it is meant that the stress induced by the electrically conductive material 25 is along the plane that is coplanar with the upper surface of the pedestal portion 30 of the semiconductor substrate 10. In contrast to the in-plane stress, the term "out-of-plane" stress means that the stress induced by the electrically conductive material 25 is perpendicular to the plane that is coplanar with the upper surface of the pedestal portion 30 of the semiconductor substrate 10. The out-of-plane stress is into a direction traveling in and out of the semiconductor substrate 10. The stress in the radial direction is an in-plane stress in a direct extending from the center of the pedestal portion 30 towards the perimeter of the pedestal portion 30 that is interfacing with the interior barrier layer 27 and/or the electrically conductive material 25. The stress in the tangential direction is an in-plane stress in a direction perpendicular to the radial direction. As illustrated in FIG. 2, assuming the TSV structure 100 does not delaminate from the semiconductor substrate 10, the radial and tangential stress in the pedestal portion 30 increases in the direction from the center of the pedestal portion 30 towards the perimeter of the pedestal portion 30 that is interfacing with the interior barrier layer 27 and/or the electrically conductive material 25. The stress plotted in FIG. 2 can be measured from field effect transistors (FETs). If the TSV structure 100 delaminates from the semiconductor substrate 10, the radial and tangential stress is relaxed and is not induced in the pedestal portion 30. If voiding occurs in the electrically conductive material 25 of the TSV, and leads to greater Joule heating due to increased current density, then the stress in the pedestal region 30 that is generated by thermal expansion mismatch will change from its original state.

In some embodiments, the methods and structures disclosed herein employ semiconductor devices to measure the stress in the pedestal portion 30 of the semiconductor substrate 10. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor, e.g., n-type or p-type conductivity. Although the semiconductor devices that are depicted in the figures of the present disclosure are field effect transistors (FET), it is noted that any semiconductor device is suitable for use with the methods and structures of the present disclosure.

Figure 3:
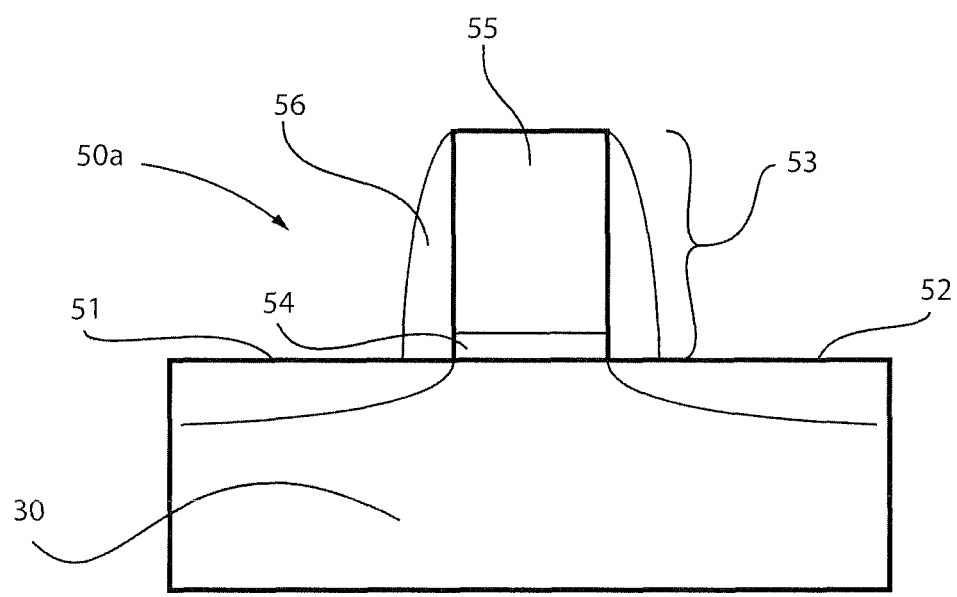
FIG. 3 is a side cross-sectional view of a field effect transistor (FET) as used to detect stress in the pedestal portion of the semiconductor layer, in accordance with one embodiment of the present disclosure.

A "field effect transistor (FET)" is a semiconductor device in which the output current, i.e., source-drain current, is controlled by the voltage applied to the gate structure. A FET has three terminals, i.e., gate structure 53, source region 51 and drain region 52, as depicted in FIG. 3. The term "gate structure" means a structure that is present on the channel region of the device that is used to control output current (i.e., flow of carriers in the channel) of a semiconducting device through electrical fields. The gate structure 53 typically includes at least one gate dielectric 54 and at least one gate conductor 55. The gate conductor 55 may be composed of any conductive material including, but not limited to W, Ni, Ti, Mo, Ta, Cu, Pt, Ag, Au, Ru, Ir, Rh, and Re, as well as heavily doped silicon, such as silicides, and alloys that include at least one of the aforementioned conductive elemental metals. The gate dielectric 54 may be a dielectric material, such as $SiO_2$, or alternatively high-k dielectrics, such as oxides of Ta, Zr, Al, Hf or combinations thereof. In another embodiment, the gate dielectric 54 is comprised of an oxide, such as $SiO_2$, $ZrO_2$, $Ta_2O_5$ or $Al_2O_3$. A gate sidewall spacer 56 may be formed on a sidewall of the gate structure 53. The gate sidewall spacer 56 may be composed of a dielectric, such as silicon nitride.

As used herein, the term "channel" is the region of the semiconductor device, e.g., FET, that is underlying the gate structure 53 and between the source region 51 and drain region 52 of the semiconductor device that becomes conductive when the semiconductor device is turned on. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

By monitoring the stress in the pedestal portion 30 present within the interior of the annular electrically conductive material 25, delamination of the TSV structure 100 from the semiconductor substrate 10 can be detected. More specifically, in some embodiments, semiconductor devices may be positioned in areas of the pedestal portion 30 to detect changes in the stress induced on the pedestal portion 30 by changes in the piezoresistive response of the semiconductor devices in comparison to the piezoresistive response of semiconductor devices that are present in portions of the semiconductor substrate 10 that are not subjected to stress from the TSV structure 100. The portions of the semiconductor substrate 10 that are not subjected to the stress from the TSV structure 100 may be referred to as being in a "neutral" stress state. The term "piezoresistive response" denotes a change in electrical properties, e.g., a semiconductor's resistance, i.e., carrier mobility, that results from the application of a mechanical stress, e.g., compressive or tensile stress. One example of piezoresistive response to the application of stress that is detectable by semiconductor devices, such as field effect transistors, is a change in the carrier mobility, e.g., electron carrier mobility or hole carrier mobility. Another example of a piezoresistive response to the application of stress that is detectable by the semiconductor devices, such as field effect transistors, is a change in threshold voltage. As used herein, "threshold voltage" is the lowest attainable gate voltage that will turn on a semiconductor device, e.g., field effect transistor (FET), by making the channel of the device conductive. In some embodiments, the application of compressive and tensile stresses can provide different piezoresistive responses, e.g., increases or decreases, in p-type and n-type conductivity semiconductor devices, such as p-type FETs or n-type FETs. A p-type field effect transistor (pFET) is a semiconductor device in which the source and drain regions are doped to a p-type conductivity. As used herein, "p-type" refers to the addition of impurities to an intrinsic semiconductor that creates deficiencies of valence electrons, such as the addition of boron, aluminum, or gallium to a type IV semiconductor, such as silicon. An n-type field effect transistor (nFET) is a semiconductor device in which the source and drain regions are doped to an n-type conductivity. As used herein, "n-type" refers to the addition of impurities to an intrinsic semiconductor that contribute free electrons, such as the addition of antimony, arsenic, or phosphorous to a type IV semiconductor, such as silicon.

For example, when a tensile stress is applied in a direction transverse to the length of the channel region (the dimension separating the source region and the drain region) of a p-type FET, the hole mobility of the p-type FET is increased, and when a tensile stress is applied in a direction transverse to the length of the channel region of an n-type FET, the hole mobility of the n-type FET is also increased. By "transverse" direction it is meant that the direction is perpendicular to the direction extending along the length of the channel region. In another example, when a tensile stress is applied in a direction longitudinal to the length of the channel region of an n-type FET, the electron mobility of the n-type FET is increased, and when a tensile stress is applied in a direction longitudinal to the length of the channel region of a p-type FET, the hole mobility of the p-type FET is decreased. By "longitudinal" direction it is meant that the direction is parallel to the direction extending along the length of the channel region. The longitudinal and transverse directions are in-plane, i.e., along a plane that is coplanar with the upper surface of the semiconductor substrate 10. In yet another example, when a compressive stress is applied in a direction transverse to the length of the channel region of a p-type FET, the hole mobility of the p-type FET is decreased, and when a compressive stress is applied in a direction transverse to the length of the channel region of an n-type FET, the electron mobility of the n-type FET is decreased. In yet a further example, when a compressive stress is applied in a direction longitudinal to the length of the channel region of an n-type FET, the electron mobility of the n-type FET is decreased, and when a compressive stress is applied in a direction longitudinal to the length of the channel region of a p-type FBI, the hole mobility of the p-type FET is greatly increased. It is noted that the above examples of piezoresistive responses to the application of a stress are provided for illustrative purposes only, and are not intended to limit the present disclosure, as other piezoresistive responses have also been contemplated to detect delamination of the TSV structure 100 from the semiconductor substrate 10.

In accordance with some embodiments of the present disclosure, at least two devices, i.e., semiconductor devices, e.g., FETs, are located within the pedestal portion 30 of an annular through-silicon via (TSV), wherein the semiconductor devices are placed at specific locations in the pedestal portion 30 to assess the stress generated by the TSV structure 100 during operation. The semiconductor device structures can be created without any additional lithography or processing steps, and to utilize complementary metal oxide (CMOS) manufacturing that is associated with either bulk-Si or silicon-on-insulator technology. This structure can identify when current is flowing through a TSV structure, due to the mismatch in coefficients of thermal expansion between the TSV conductor material and substrate, and, if the current density is too great, provide a warning to shut down the TSV structure. The structure would be able to detect if delamination occurred between the TSV and semiconductor substrate.

Figure 4:
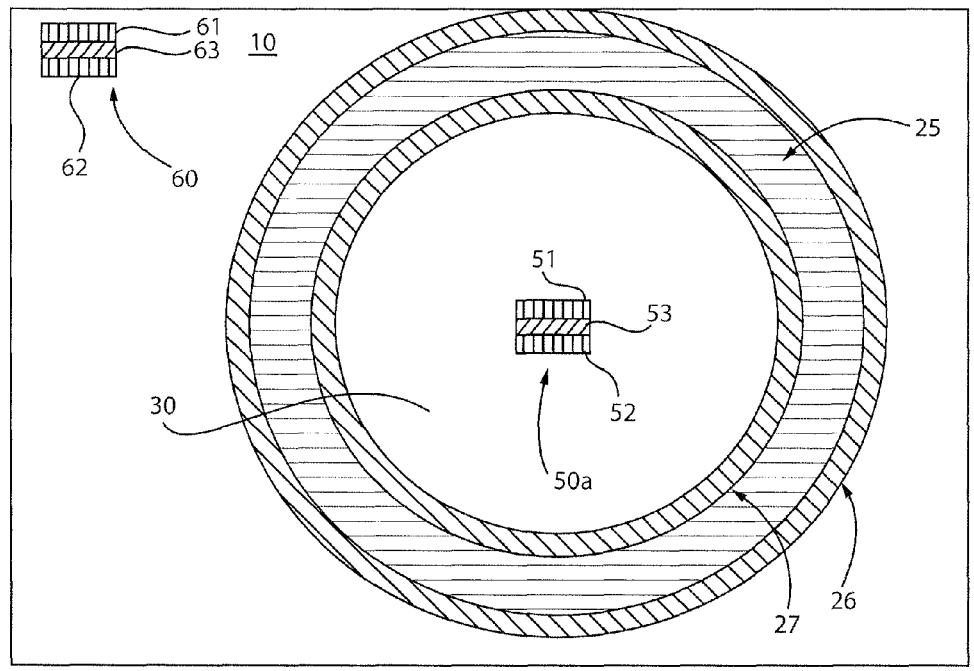
FIG. 4 is a top down view depicting one embodiment of a semiconductor device that is present on a pedestal portion of a semiconductor layer that is present within the interior of an annular electrically conductive material of a TSV structure, wherein the semiconductor device detects stress in the pedestal portion of the semiconductor layer.

FIG. 4 depicts one embodiment of a TSV structure 100 possessing an annular configuration that includes an electrically conductive material 25 and barrier liners 26, 27 that separate the electrically conductive material 25 from the field region of the semiconductor substrate 30 and from a pedestal portion 30 created from the semiconductor substrate 10. The structure for detecting delamination of TSV structures 100 may include at least one semiconductor device, e.g., FET 50a, that is placed at the center of the pedestal portion 30 for detecting stress that is induced on the pedestal portion 30 by at least the electrically conductive material 25 of the TSV structure 100. The at least one semiconductor device, e.g., FET 50a, may include a source region 51, drain region 52 and a gate structure 53. The source and drain regions 51, 52 may be doped to an n-type or p-type conductivity. In this embodiment, a reference semiconductor device 60, such as a field effect transistor (FET) may be positioned on a field region of the semiconductor substrate 10 for comparison. The reference semiconductor device 60 may be functionally and geometrically similar to the at least one semiconductor device, e.g., FET 50a, that is present on the pedestal portion 30 of the semiconductor substrate 10. For example, similar to the at least one semiconductor device, e.g., FET 50a, the reference semiconductor device 60 may be a field effect transistor (FET) including a source region 61, drain region 62 and a gate structure 63.

To provide for comparison to a stressed pedestal portion 30, the portion of the field region of the semiconductor substrate 10 that the reference semiconductor device 60 is present on may have a neutral stress state. In some embodiments, for comparative purposes the source and drain regions 61, 62 of the reference semiconductor device 60 may be doped to a same conductivity type as the source and drain regions 51, 52 of the at least one semiconductor device, e.g., FET 50a, that is present on the pedestal portion 30 of the semiconductor substrate 10. For example, the source and drain regions 61, 62 of the reference semiconductor device 60 and the source and drain regions 51, 52 of the at least one semiconductor device 50a may both be doped to a p-type conductivity.

By comparing the piezoresistive response, e.g., threshold voltage, of at least one semiconductor device 50a that is present on the pedestal portion 30 to the threshold voltage of the reference semiconductor device 60, a difference between their behavior can be directly related to the stress generated by the TSV structure 100. This stress, generated due to the mismatch in coefficients of thermal expansion between the electrically conductive material 25 of the TSV structure 100 and the material of the semiconductor substrate 10, is sensitive to the local temperature. When current density within a TSV structure 100 becomes too high, then Joule heating increases the temperature of the environment. By monitoring the at least one semiconductor device 50a over time, the corresponding stress generated within the pedestal portion 30 of the semiconductor substrate 10 that is detected by the at least one semiconductor device 50a can be used to indicate that excessive current is flowing through the TSV structure 100. Alternatively, the lack of a difference in the piezoresistive response, e.g., threshold voltage, between the reference semiconductor device 60 on the field region portion of the semiconductor substrate 10 and the at least one semiconductor device 50a that is present on the pedestal portion 30 of the semiconductor substrate 10 can signal that no stress is being generated within the TSV structure 100. This can indicate that delamination between the TSV structure 100 and the semiconductor substrate 30 has taken place.

Figure 5:
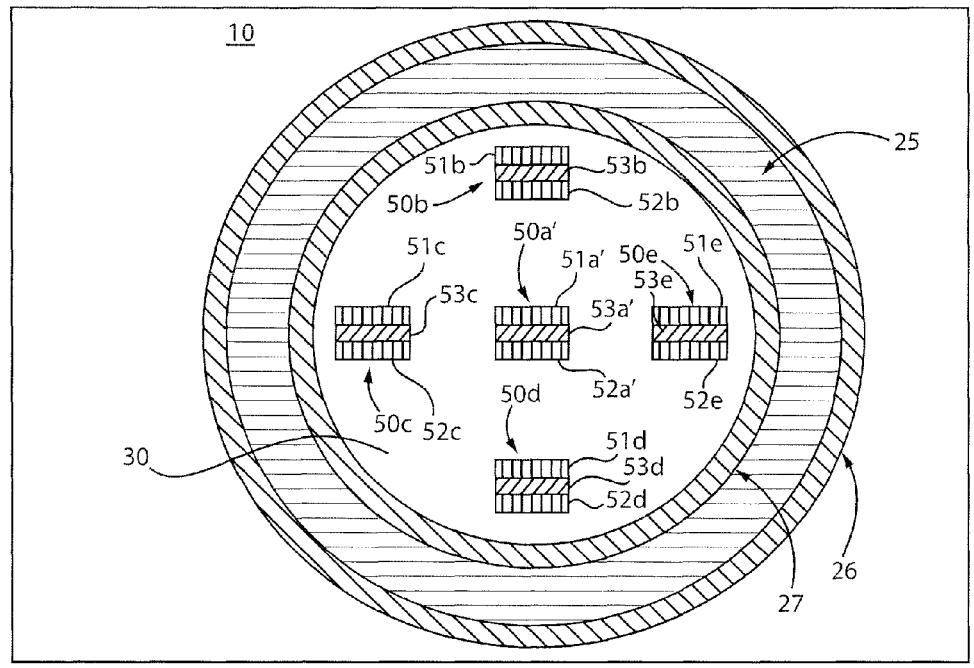
FIG. 5 is a top down view depicting one embodiment of a plurality of semiconductor devices in a pedestal portion of a semiconductor layer, wherein a reference semiconductor device is centrally positioned on the pedestal portion of the semiconductor layer, and at least one stress measuring semiconductor device is present adjacent to an interior perimeter of the electrically conductive material, in accordance with one embodiment of the present disclosure.

FIG. 5 depicts one embodiment of a plurality of semiconductor devices 50a', 50b, 50c, 50d, 50e that are present on the pedestal portion 30 of the semiconductor substrate 10. In the embodiment that is depicted in FIG. 5, a reference semiconductor device 50a' is centrally positioned on the pedestal portion 30 of the semiconductor substrate 10. The central portion of the pedestal portion 30 of the semiconductor substrate 10 is the region of the pedestal portion that is farthest away from the stress inducing electrically conductive material 25 of the TSV structure 100. As illustrated in FIG. 2, the center of the pedestal portion 30 may have a substantially neutral stress state. In some embodiments, the electrical properties, e.g., threshold voltage, of the reference semiconductor device 50a' may serve as a basis for comparison with the measurement of the piezoresistive response, e.g., change threshold voltage, in the stress measuring semiconductor devices 50b, 50c, 50d, 50e, which can change in response to changes in the stress applied to the pedestal portion 30 that the stress measuring semiconductor device 50b, 50c, 50d, 50e are present on.

Referring to FIG. 5, the plurality of semiconductor devices 50a', 50b, 50c, 50d, 50e also includes at least one stress measuring semiconductor device 50b, 50c, 50d, 50e present adjacent to the interior perimeter of the electrically conductive material 25 that is encircling the pedestal portion 30 of the semiconductor substrate 10. In one embodiment, semiconductor devices 50a', 50b, 50c, 50d, 50e that are placed on the pedestal portion 30 of the semiconductor substrate 10 are complementary metal oxide semiconductor (CMOS) transistors, in which the current flows across the channel region that is under the gate structure 53a', 53b, 53c, 53d, 53e from the source regions 51a', 51b, 51c, 51d, 51e to the drain regions 52a', 52b, 52c, 52d, 52e. In one embodiment, the plurality of semiconductor devices 50a', 50b, 50c, 50d, 50e includes five devices that are placed at various orientations about the pedestal portion 30 of the semiconductor substrate 10. For example, in the stress measuring semiconductor devices identified by reference numbers 50b and 50d, the orientation of current flow is in the radial direction with respect to the center of the pedestal portion 30 of the semiconductor substrate 10. In the stress measuring semiconductor devices identified by reference numbers 50c and 50e, the orientation of current flow is in the orthogonal direction relative to the center of the pedestal portion 30 of the semiconductor substrate 10. In some examples, because the magnitude of stress is expected to be greater in the radial direction near the outer diameter of the pedestal portion 30 that interfaces with the interior barrier layer 27/electrically conductive material 25, the piezoresistive response will differ between stress measuring semiconductor devices 50b, 50d, in which the current flow is in the radial direction (relative to the center of the pedestal portion 30), and the stress measuring semiconductor devices 50c, 50e, in which the current flow is in the orthogonal direction (relative to the center of the pedestal portion 30). This can allow for enhanced detection of the stress.

Each of the plurality of semiconductor devices 50a', 50b, 50c, 50d, 50e may have source and drain regions 51a', 51b, 51c, 51d, 51e, 52a', 52b, 52c, 52d, 52e doped to a p-type conductivity or n-type conductivity. In one embodiment, one set of stress measuring semiconductor devices includes at least one device in which the current flow is in the orthogonal direction and at least one device in which the current flow is in the radial direction, e.g., the devices identified by reference numbers 50c and 50b, are n-type transistors (NMOS); and one set of stress measuring semiconductor devices includes at least one device in which the current flow is in the orthogonal direction and at least one device in which the current flow is in the radial direction, e.g., the devices identified by reference numbers 50d and 50e, are p-type transistors (PMOS). In one embodiment, a pair of an n-type semiconductor device, e.g., nFET, and a p-type semiconductor device, e.g., pFET, are centrally positioned on the pedestal portion 30, and are substituted for the single reference semiconductor device 50a' that is depicted centrally positioned on the pedestal portion 30 of the semiconductor substrate 10.

By comparing the piezoresistive response, e.g., difference in threshold voltage, between the reference semiconductor device 50a' that is placed at center of the pedestal portion 30 of the semiconductor substrate 10 and the stress measuring semiconductor devices 50b, 50c, 50d, 50e that are position near the outer radius of the pedestal portion 30; a difference between their behavior can be directly related to the stress generated by the TSV structure 100. This stress, generated due to the mismatch in coefficients of thermal expansion between the electrically conductive material 25 of the TSV structure 100 and the semiconductor substrate 10 is sensitive to the local temperature. For example, when current density within a TSV structure 100 becomes too high, the Joule heating will increase the temperature of the environment. The corresponding stress generated by thermal expansion in response to Joule heating within the pedestal portion 30 of the TSV structure 100 can be used to indicate that excessive current is flowing through the TSV structure 100. Further, the absence of a difference in piezoresistive response, e.g., threshold voltage, between the reference semiconductor device 50a' and the stress measuring semiconductor devices 50b, 50c, 50d, 50e can signal that no stress is generated within the TSV structure 100, which can indicate that delamination between the TSV structure 100 and semiconductor substrate 10 has taken place.

The TSV structures 100 depicted in FIGS. 4 and 5 may be integrated into any electrical device in which vertical electrical communication may be employed. For example, the TSV structure 100 may be employed to integrate multiple integrated circuits, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input device, and a central processor.

In another aspect of the present disclosure, a method is provided for forming a structure for detecting delamination in electrical connection structures, e.g., TSV structures. The details of some embodiments of the method for forming a structure for detecting changes in the integrity of electrical connection structures are now described with more detail by referring to the flow diagram depicted in FIG. 6. In one embodiment, the method may begin with forming an electrically conductive material 25 extending through an entire depth of a semiconductor layer, e.g., semiconductor substrate 10, wherein the electrically conductive material 25 has a geometry that encloses a pedestal portion 30 of the semiconductor substrate 10 within an interior perimeter of the electrically conductive material 25, as depicted in FIGS. 1, 4 and 5.

In one embodiment, forming the electrically conductive material 25 may begin at step 65 with forming an annular opening through a semiconductor substrate 10, in which a pedestal portion 30 of the semiconductor substrate 10 is centrally positioned in the annular opening. The annular opening may be formed using deposition, photolithography and etch processes. For example, in one embodiment, an etch mask may be formed by depositing a mask material on an upper surface of the semiconductor substrate 10. The mask material may be composed of a photoresist material that is patterned and developed to expose the portions of the semiconductor substrate 10 that are to be etched in forming the annular opening. At least one portion of the photoresist material is present overlying the portion of the semiconductor substrate 10 that provides the pedestal portion 30. In some embodiments, a dielectric layer, such as thermally formed oxide, may be present between the semiconductor substrate 10 and the etch mask. The thermally formed oxide may be patterned using the etch mask in combination with an etch process, wherein following etching the thermally formed oxide is used as a hard mask in etching the semiconductor substrate 10 to form the annular opening. The etch processes for etching the semiconductor substrate 10 may be a directional etch, such as reactive ion etch (RIE) or deep reactive ion etch (DRIE). Further details regarding forming the annular opening can be found in U.S. Pat. No. 7,902,069, titled "Small. Area, Robust Silicon Via Structure and Process", which is incorporated herein by reference.

In a following step 66, an interior barrier layer 27 and an exterior barrier layer 26 is formed on the sidewalls of the annular opening and the pedestal portion 30 of the semiconductor substrate 10. The interior barrier layer 27 and the exterior barrier layer 26 may be formed using any suitable method including, but not limited to, atomic layer deposition, chemical vapor deposition, physical vapor deposition, and sputtering.

Figure 6:
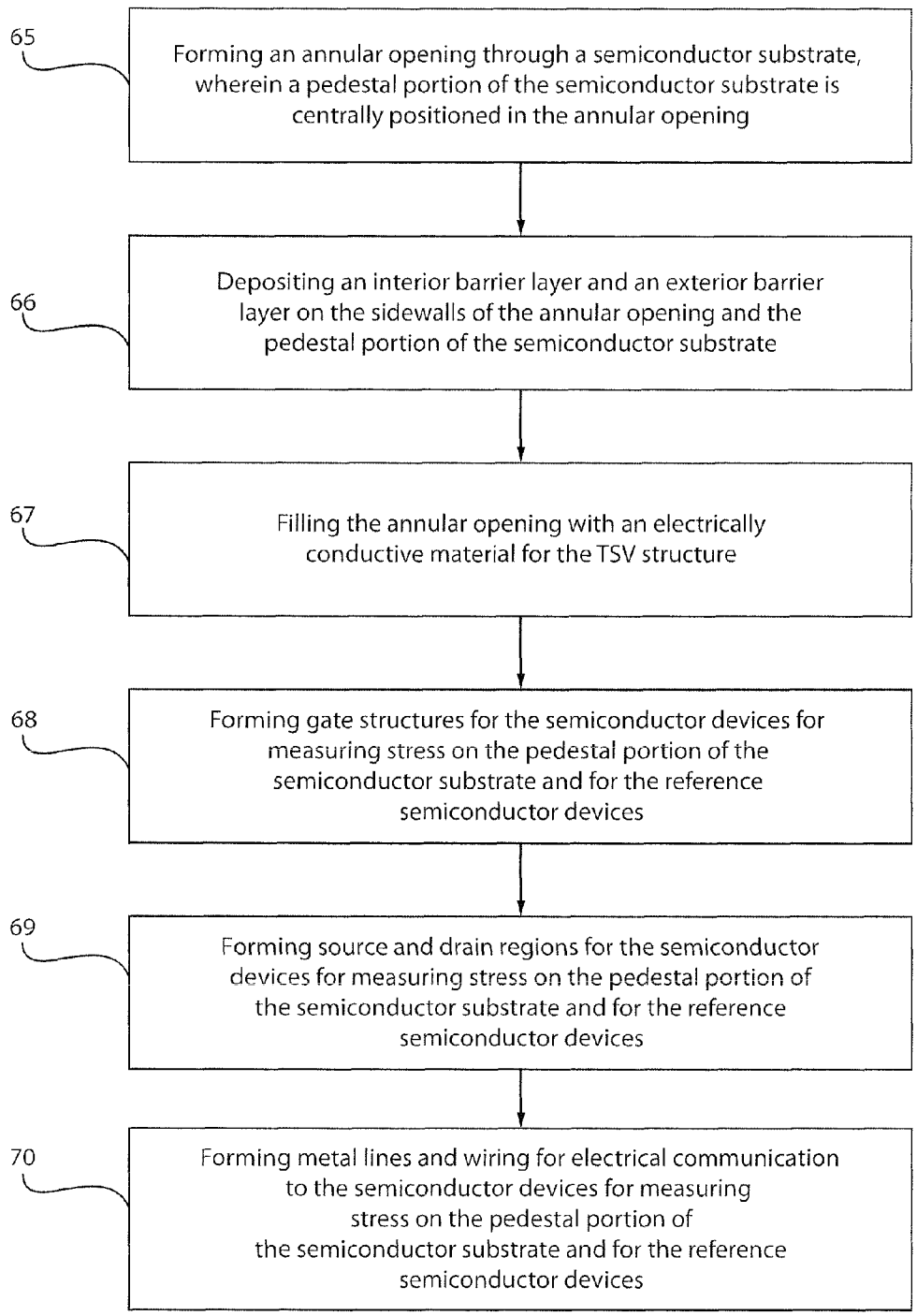
FIG. 6 is a flow diagram illustrating a method of forming a structure for detecting changes in the integrity of electrical connection structures, in accordance with one embodiment of the present disclosure.

At step 67 of the process flow depicted in FIG. 6, the annular opening is filled with an electrically conductive material 25 for the TSV structure 100, as depicted in FIGS. 1, 4 and 5. The electrically conductive material 25 may be deposited using a physical vapor deposition (PVD) method, such as sputtering, a chemical vapor deposition (CVD) method, or by plating, electroplating and combinations thereof. In some embodiments, a planarization process may be applied to the top side surface and/or back side surface of the TSV structure 100. The planarization process may include chemical mechanical planarization.

Following formation of the TSV structure 100, the reference semiconductor device and the stress measuring semiconductor devices may be formed. For example, the reference semiconductor device 60 may be formed on a field region of the semiconductor substrate 10 to the exterior of the TSV structure 100, and the stress measuring semiconductor device 50a may be formed on the pedestal portion 30 of the semiconductor substrate 10, as depicted in FIG. 4. In another embodiment, the reference semiconductor device 50a' may be formed on at the center of the pedestal portion 30 of the semiconductor substrate 10, and the stress measuring semiconductor devices 50b, 50c, 50d, 50e may be formed on the perimeter of pedestal portion 30 of the semiconductor device, as depicted in FIG. 5. In one embodiment, forming the reference semiconductor device and the stress measuring semiconductor devices may begin with forming the gate structures to the devices at step 68 of the process flow depicted in FIG. 6.

Referring to FIG. 3, the gate structures 53 can be formed using deposition, photolithography and a selective etching process. First, a gate stack of material layers for the gate conductor 55 and the gate dielectric 54 is deposited on the semiconductor substrate 10 using a deposition process, such as chemical vapor deposition (CVD). Thereafter, an etch mask, i.e., pattern, is formed on the gate stack. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections of the gate stack covered by the patterned photoresist are protected while the exposed regions are removed using a selective etching process that removes the unprotected regions, wherein the remaining portions of the gate stack provides the gate conductor 55 and the gate dielectric 54. The etch process may be reactive ion etch. Next the photoresist pattern, i.e., mask, is removed. The gate sidewall spacers 56 may be formed using conformal deposition and etch back processing.

Referring to step 69 of the process flow depicted in FIG. 6, source and drain regions 51, 51a', 51b, 51c, 51d, 51e, 52, 52a', 52b, 52c, 52d, 52e, 61, 62 may be formed for each of the reference semiconductor device 50a', 60, and each of the stress measuring semiconductor devices 50a, 50b, 50c, 50d, 50e on opposing sides of the gate structures 53, 53a', 53b, 53c, 53d, 53e, 63, as depicted in FIGS. 3, 4 and 5. The source and drain regions 51, 51a', 51b, 51c, 51d, 51e, 52, 52a', 52b, 52c, 52d, 52e, 61, 62 can be formed by ion implanting n-type and p-type dopants into the semiconductor substrate 10. Photoresist block masks may be employed to provide for selective ion implantation so that the source and drain regions 51, 51a', 51b, 51c, 51d, 51e, 52, 52a', 52b, 52c, 52d, 52e, 61, 62 can be independently implanted with n-type or p-type dopants. In some embodiments, isolation between adjacent semiconductor devices can be provided by counterdoped well regions separating adjacent semiconductor devices.

At step 70 of the process flow depicted in FIG. 6, metal lines and wiring may be formed to provide electrical communication to each of the reference semiconductor devices 50a', 60, and each of the stress measuring semiconductor devices 50a, 50b, 50c, 50d, 50e. The metal lines and vias may be in contact with each of the terminals of the semiconductor devices, e.g., gate structures, source regions and drain regions. In some embodiments, the metal lines and vias may be deposited using a physical vapor deposition (PVD) method, such as sputtering, a chemical vapor deposition (CVD) method, or by plating, and may be further defined using an etch process, such as a directional and/or selective etching. As described above, a piezoresistive response measured from the at least one stress measuring semiconductor devices 50a', 50b, 50c, 50d, 50e that is different from the piezoresistive response of a reference semiconductor device 50a, 60 indicates a stress induced by the electrically conductive material 25 of the TSV structure 100 on the pedestal portion 30 of the semiconductor substrate 10. If no difference is measured between the piezoresistive response of the stress measuring semiconductor devices 50a', 50b, 50c, 50d, 50e and the reference semiconductor devices 50a, 60, delamination may have occurred in the TSV structure 100.

In another aspect, a method of monitoring delamination in electrical connection structures, e.g., TSV structures, is provided. One embodiment of a method for monitoring delamination in TSV structures is illustrated in the flow diagram depicted in FIG. 7. In some embodiments, the method may begin with providing a plurality of electrical connection structures, e.g., TSV structures 100, through a semiconductor substrate 10 that each include an electrically conductive material 25 having a geometry, e.g., annular geometry, that encloses a pedestal portion 30 of the semiconductor substrate 10, at step 71. One embodiment of forming TSV structures 100 suitable for the description of step 71 in FIG. 7 has been described above in steps 65-67 of the process flow depicted in FIG. 6.

Figure 7:
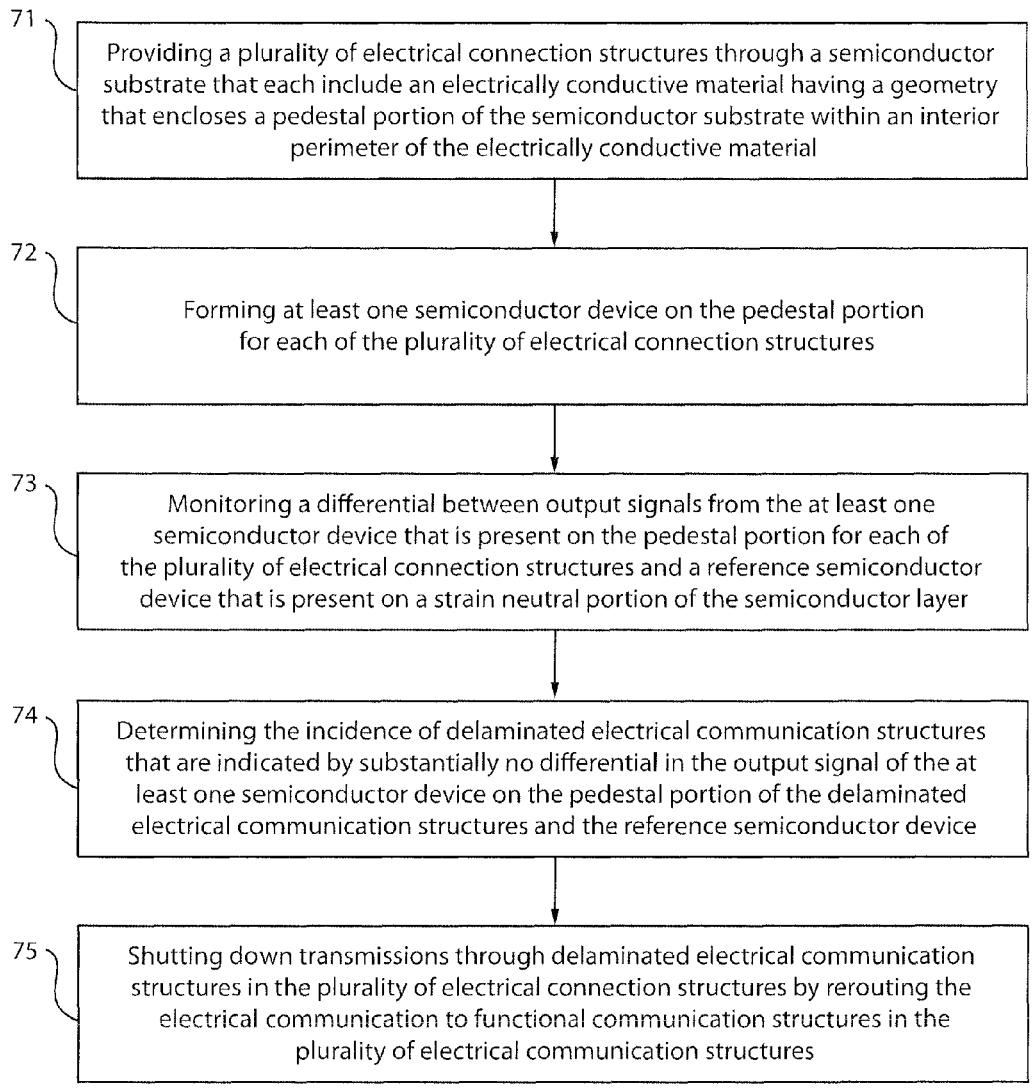
FIG. 7 is a flow diagram illustrating a method of monitoring delamination in electrical connection structures using at least one semiconductor device that is formed on a pedestal portion of a semiconductor layer, in accordance with one embodiment of the present disclosure.

In a following step 72 of the process flow depicted in FIG. 7, at least one semiconductor device 50, 50a', 50b, 50c, 50d, 50e is formed on the pedestal portion 30 for each of the plurality of electrical connection structures, e.g., TSV structures 100. One embodiment of forming a semiconductor device on the pedestal portion 30 of the semiconductor substrate 100 that is suitable for the description of step 72 in FIG. 7 has been described above with reference to steps 68-70 of the process flow depicted in FIG. 6.

At step 73 of the process flow for monitoring delamination in electrical connection structures, e.g., TSV structures 100, that is depicted in FIG. 7, a differential between output signals from the at least one semiconductor devices 50, 50b, 50c, 50d, 50e for detecting stress that are present on the pedestal portion 30 for each of the plurality of electrical connection structures and a reference semiconductor device 50a', 60 that is present on a stress neutral portion of the semiconductor substrate 10 is monitored. Step 73 of the process flow depicted in FIG. 7 has been described above with reference to FIGS. 4 and 5.

At step 74 of the process flow for monitoring delamination in electrical connection structures, e.g., TSV structures 100, that is depicted in FIG. 7, a determination is made of the incidence of delamination in the electrical communication structures, e.g., TSV structure 100. Delamination of the electrical communication structures may be indicated by substantially no differential in the output signal of the at least one semiconductor device on the pedestal portion 30 of the delaminated electrical communication structures and the reference semiconductor device that is present on a stress neutral portion of the semiconductor substrate. Step 74 of the process flow depicted in FIG. 7 has been described above with reference to FIGS. 4 and 5.

Referring to FIG. 7, at step 75 of the process flow for monitoring delamination in electrical connection structures, e.g., TSV structures, electrical transmissions through delaminated electrical communication structures is shut down in the plurality of electrical connection structures by rerouting the electrical communication to functional electrical communication structures in the plurality of electrical communication structures.

Figure 8:
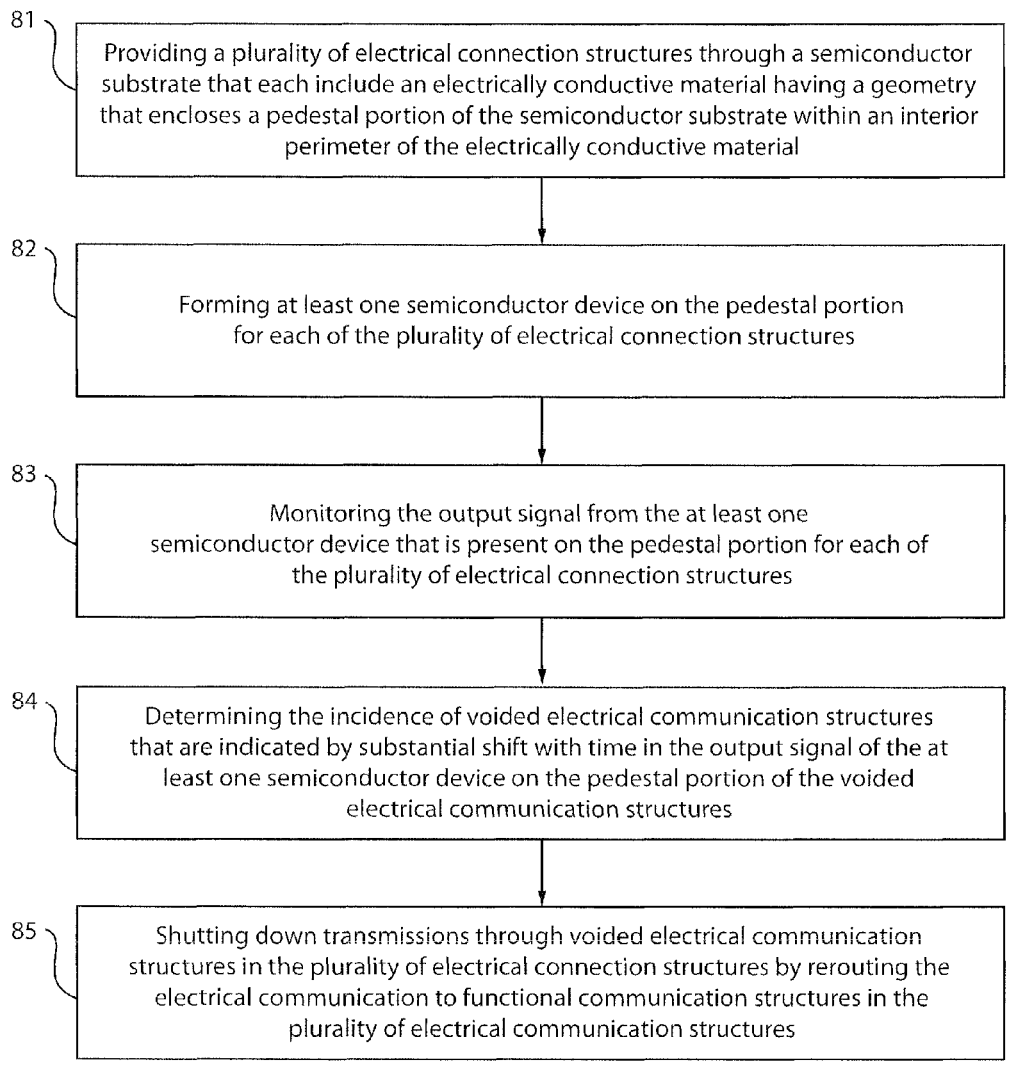
FIG. 8 is a flow diagram illustrating a method of monitoring the formation of voids in electrical connection structures using at least one semiconductor device that is formed on a pedestal portion of a semiconductor layer, in accordance with one embodiment of the present disclosure.

FIG. 8 depicts the process flow of another embodiment of the present disclosure, in which a method of monitoring the formation of voids in electrical connection structures is provided using at least one semiconductor device that is formed on a pedestal portion of a semiconductor layer. The formation of voids may occur in the electrically conductive material 25 of the TSV structure 100. Steps 81 and 82 of the method depicted in FIG. 8 have been described above with reference to steps 71 and 72 of FIG. 7. At steps 83 and 84 of the process flow depicted in FIG. 8, the output signal from the at least one semiconductor device that is present on the pedestal portion for each of the plurality of electrical connection structures is monitored, wherein the incidence of voided electrical communication structures is indicated by a substantial shift with time in the output signal of the at least one semiconductor device on the pedestal portion of the voided electrical communication structures. For example, the time at which the output signal measured from the at least one semiconductor device may increase or decrease when voids are present in the electrical connection structure, since the strain imposed on the device will change over time, and the carrier mobility will increase or decrease depending on whether the device has a p-type or n-type conductivity, e.g., is an nFET or pFET device. At step 85 of the process flow depicted in FIG. 8, transmissions through the voided electrical communication structures are shut down by rerouting the electrical communication to functional electrical communication structures in the plurality of electrical communication structures.

In another aspect of the present disclosure, the method of monitoring the integrity of electrical connection structures, e.g., TSV structures, may be integrated into a computer program product. For example, in one embodiment, a computer readable storage medium, such as a non-transistory computer readable storage media, is provided that includes a computer readable program for monitoring the integrity of electrical connection structures, wherein the computer readable program when executed on a computer causes the computer to perform steps that include monitoring a differential between output signals from at least one semiconductor device that is present on the pedestal portion 30 of a semiconductor substrate for each of a plurality of electrical connection structures, e.g., TSV structure, including an annular electrically conductive material, and output signals from a reference semiconductor device that is present on a stress neutral portion of the semiconductor substrate. In a following step, transmissions through delaminated electrical communication structures and/or electrical communication structures including voids in the plurality of electrical connection structures are shut down by rerouting the electrical communication to functional electrical communication structures in the plurality of electrical communication structures, wherein incidence of the delaminated electrical communication structures and/or the electrical communication structures including voids is indicated by changes in differences between the output signal of the at least one semiconductor device on the pedestal portion of the delaminated electrical communication structures and/or electrical communication structures including voids and the reference semiconductor device.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure have been described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A structure to detect changes in integrity of electrical connection structures comprising:
 a semiconductor layer;
 an electrically conductive material extending through an entire depth of the semiconductor layer, wherein the electrically conductive material has a geometry that encloses a pedestal portion of the semiconductor layer within an interior perimeter of the electrically conductive material; and
 at least one semiconductor device formed on the pedestal portion of the semiconductor layer, the at least one semiconductor device configured to detect stress in the pedestal portion of the semiconductor layer,
 wherein the at least one semiconductor device is a field effect transistor (FET), and
 wherein the at least one semiconductor device comprises:
  a reference semiconductor device centrally positioned on the pedestal portion of the semiconductor layer; and
  at least one stress measuring semiconductor device present adjacent to the interior perimeter of the electrically conductive material.

2. The structure of claim 1, wherein the stress detected by the at least one semiconductor device is correlated to an incidence of delamination of the electrically conductive material from the semiconductor layer.

3. The structure of claim 1, wherein the stress detected by the at least one semiconductor device is correlated to an incidence of voids present in the electrically conductive material.

4. The structure of claim 1 further comprising an interior barrier layer that is present between the electrically conductive material and the pedestal portion of the semiconductor layer, and an exterior barrier layer is present between the electrically conductive material and a field portion of the semiconductor layer outside an exterior perimeter of the electrically conductive material.

5. The structure of claim 1, wherein the geometry of the electrically conductive material is annular.

6. The structure of claim 5, wherein the at least one stress measuring semiconductor device comprises:
 at least one first orientation stress measuring semiconductor device having a first channel direction that is substantially parallel with a tangential direction of the electrically conductive material having the annular geometry; and
 at least one second stress measuring semiconductor device having a second channel direction that is substantially perpendicular with the tangential direction of the electrically conductive material having the annular geometry.

7. A structure to detect changes in integrity of electrical connection structures comprising:
 a semiconductor layer;
 an electrically conductive material extending through an entire depth of the semiconductor layer, wherein the electrically conductive material has an annular geometry that encloses a pedestal portion of the semiconductor layer within an interior perimeter of the electrically conductive material; and
 at least one semiconductor device formed on the pedestal portion of the semiconductor layer, wherein the at least one semiconductor device detects stress in the pedestal portion of the semiconductor layer, wherein the at least one semiconductor device that is formed on the pedestal portion of the semiconductor layer includes:
  a reference semiconductor device centrally positioned on the pedestal portion of the semiconductor layer; and
  at least one stress measuring semiconductor device present adjacent to the interior perimeter of the electrically conductive material.

8. The structure of claim 7, wherein the at least one stress measuring semiconductor device comprises:
 at least one first orientation stress measuring semiconductor device having a first channel direction that is substantially parallel with a tangential direction of the electrically conductive material having the annular geometry; and
 at least one second stress measuring semiconductor device having a second channel direction that is substantially perpendicular with the tangential direction of the electrically conductive material having the annular geometry.

9. The structure of claim 7, wherein the stress detected by the at least one semiconductor device is correlated to an incidence of delamination of the electrically conductive material from the semiconductor layer.

10. The structure of claim 7, wherein the stress detected by the at least one semiconductor device is correlated to an incidence of voids present in the electrically conductive material.

11. The structure of claim 7, further comprising an interior barrier layer that is present between the electrically conductive material and the pedestal portion of the semiconductor layer, and an exterior barrier layer is present between the electrically conductive material and a field portion of the semiconductor layer outside an exterior perimeter of the electrically conductive material.

12. The structure of claim 7, wherein the at least one semiconductor device is a field effect transistor (FET).

* * * * *